(12) United States Patent
Baumgartner et al.

(10) Patent No.: US 6,993,470 B2
(45) Date of Patent: Jan. 31, 2006

(54) METHOD OF EVALUATING TEST CASES IN A SIMULATION ENVIRONMENT BY HARVESTING

(75) Inventors: Yoanna Baumgartner, Austin, TX (US); Maureen T. Davis, Austin, TX (US); Joseph D. Gerwels, Austin, TX (US); Kirk E. Morrow, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 906 days.

(21) Appl. No.: 09/891,340

(22) Filed: Jun. 26, 2001

(65) Prior Publication Data

US 2003/0061581 A1   Mar. 27, 2003

(51) Int. Cl.
G06F 17/50   (2006.01)
(52) U.S. Cl. .............................. 703/17; 703/13; 703/14; 716/4; 716/5
(58) Field of Classification Search ................... 703/17, 703/13, 14; 714/17, 741, 25, 27, 32, 724, 714/737; 716/4, 5
See application file for complete search history.

(56) References Cited

U.S. PATENT DOCUMENTS 6,141,630 A * 10/2000 McNamara et al. .......... 703/14
6,182,258 B1 * 1/2001 Hollander ................... 714/739
6,327,551 B1 * 12/2001 Peterson et al. ................ 703/1
6,675,138 B1 * 1/2004 Hollander et al. ............ 703/13
6,687,662 B1 * 2/2004 McNamara et al. .......... 703/14
6,810,372 B1 * 10/2004 Unnikrishnan et al. ....... 703/13

OTHER PUBLICATIONS

K. L. Karavanic, B. P. Miller, "Improving Onlin Performance Dianosis by the Use of Historical Performance Data" ACM, 1999, pp. 1-11.*

* cited by examiner

Primary Examiner—Paul L. Rodriguez
Assistant Examiner—Dwin M. Craig
(74) Attorney, Agent, or Firm—Carr LLP; Diana R. Gerhardt

(57) ABSTRACT

The invention presents a method for selecting test cases in a test simulation of logic designs to improve speed and effectiveness of such testing. The method for selecting such test cases after such test cases are generated includes generating a test-coverage file and a harvest-goals file for the test case. The harvest-goals file contains a list of events and initial goal for each event. Harvest criteria is used to determined whether the number of hits for each event meets the initial goal. By applying the harvest criteria to the test case, it is determined whether to harvest the test case. The test case is saved and identified for harvest, if the test case is determined to be harvested. Also, the harvest-goals file is adjusted, if the test case is determined to be harvested.

20 Claims, 3 Drawing Sheets

METHOD OF EVALUATING TEST CASES IN A SIMULATION ENVIRONMENT BY HARVESTING

BACKGROUND OF THE INVENTION

1. Field of the Invention

The invention relates generally to a method for regression-test simulation of logic designs and, more particularly, to a method for evaluating and selecting test cases used in regression-test simulation of logic designs to improve the speed and effectiveness of such a test simulation.

2. Description of the Related Art

One of the most popular methods of designing complex logic circuits such as Very Large Scale Integrated Circuits (VLSIs) is by designing circuits at a higher level of abstraction and then converting the design into a lower level of abstraction. The highest level is used to describe the behavioral aspect of circuits in a programming language called Hardware Description Language (HDL) such as VHDL, or VHSIC (Very High Speed Integrated Circuit) HDL. The second highest level is a gate-level schematic or net-list. Finally, there is a transistor-level schematic or net-list. Design engineers initially design their circuits at the highest level in HDLs such as VHDL, and then obtain designs at lower levels from the highest-level design. They may test the designs at one or more levels of abstraction, in an effort to design the final circuit layout incorporating all behavioral characteristics of the intended circuit in an effective manner.

For designs described at low levels of abstraction, design engineers have access to commercial tools that successfully automate many design steps. For example, some of these tools can synthesize integrated circuit layouts directly from design descriptions written in standard HDLs. The models that are input to these synthesis tools are generally written at a level of abstraction called Register-Transfer Level (RTL). At this level, the input and output signals of the design are represented as bits and bit vectors. Since behavior is defined over these signals for every step of the system clock, RTL descriptions for complex circuits can easily fill thousands of pages. Because they are highly complex, it is normally quite difficult to determine from RTL models whether the system represented meets the system requirements. Therefore, the usual approach is to build requirements models at a much more abstract level than that of RTL. This abstract specification level is usually termed a "behavioral level." The simplicity of behavioral models makes them relatively easy to analyze and, if they are written in an executable language, faster to test through simulation. Behavioral models represent excellent specifications for RTL models in a top-down design paradigm.

Generating an implementing RTL model from a behavioral specification model can be difficult because of the vast differences in the levels of abstraction. For example, in contrast to the bits and bit vectors of RTL models, behavioral models often employ more complex data types such as arrays, records, and enumerated types. Furthermore, the time steps used at the behavioral level might represent long sequences of RTL time steps.

Today, a common simulation practice is to automate much of the detailed interaction with the implementation model within a second simulation model. This second simulation model acts as the environment for the implementation. Such environment models, often called "test benches," can vary quite drastically in their ability to reduce the designer workload at simulation time. At one extreme, the test bench might simply read input test vectors from a file, apply the vectors to the implementation model, and then write the implementation outputs to a second file. Such a test bench would be relatively easy to construct, but would offer little automation since the designer would still be required to generate the input vectors stored in the input file and to certify the results stored into the output file.

One of the major problems facing integrated circuit (IC) design engineers is the verification of their lower-level designs before the designs are fabricated in a hardware form. In particular, engineers face constant pressure to deliver larger and more complex designs in shorter design cycle times and still ensure that the devices flawlessly perform the desired functions. As hardware designs become more and more complex, logic simulation test cases and environments also become more and more complex. Hand-written test cases become time-prohibitive, whereas automatic test generation may easily lead to test cases running thousands of cycles with no accountability. If a circuit is not tested for all expected behavior, some defects may be undetected during logic simulation. In addition, because of unexpected situations, there may be a combination of events that a test bench does not check. Test cases, whether generated automatically or manually, are not generally optimized to cover a test bench 100%. Some test cases may be redundant, overlapping with other test cases in test coverage.

Therefore, there is a need for a method of selecting and maintaining effective test cases in a simulation environment (i.e., a test bench) for hardware designs.

SUMMARY OF THE INVENTION

The present invention comprises a method for selecting test cases used in a regression test simulation of logic designs to improve the speed and effectiveness of such testing. A method for selecting such test cases includes generating a harvest-goals file containing a list of events, an initial goal for each event, and an accumulative count of hits for each event. The method also includes picking a test case from a test-case list previously generated for a test simulation of a logic circuit design. A corresponding test-coverage file for the test case is also picked. Harvest criteria is applied to the test case by using the test-coverage file and the harvest-goals file, wherein it is determined whether the accumulative count of hits for each event meets the initial goal. The accumulative count of hits for an event is incremented by the number of hits for the event contained in the test-coverage file. Then, it is determined whether to harvest the test case based on the determination of whether the number of hits for each event meets the initial goal. The test case is saved and identified for harvest, if the test case is determined to be harvested. Also, the harvest-goals file is updated by adjusting the accumulative count of hits. Finally, it is determined whether all test cases are processed.

Alternatively, test cases are selected during test-case generation. A method of selecting test cases during test-case generation includes generating a harvest-goals file containing a list of events, an initial goal for each event, and an accumulative count of hits. The method also includes generating a test case. A corresponding test-coverage file for the test case is generated. Harvest criteria is applied to the test case by using the test-coverage file and the harvest-goals file, wherein it is determined whether the accumulative count of hits for each event meets the initial goal. The accumulative count of hits for an event is incremented by the number of hits for the event contained in the test-coverage file. Then, it is determined whether to harvest the test case based on the determination of whether the number of hits for each event meets the initial goal. The test case is saved and identified for harvest, if the test case is determined to be harvested. Also, the harvest-goals file is updated by adjusting the accumulative count of hits. Finally, it is determined whether all necessary test cases are generated.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
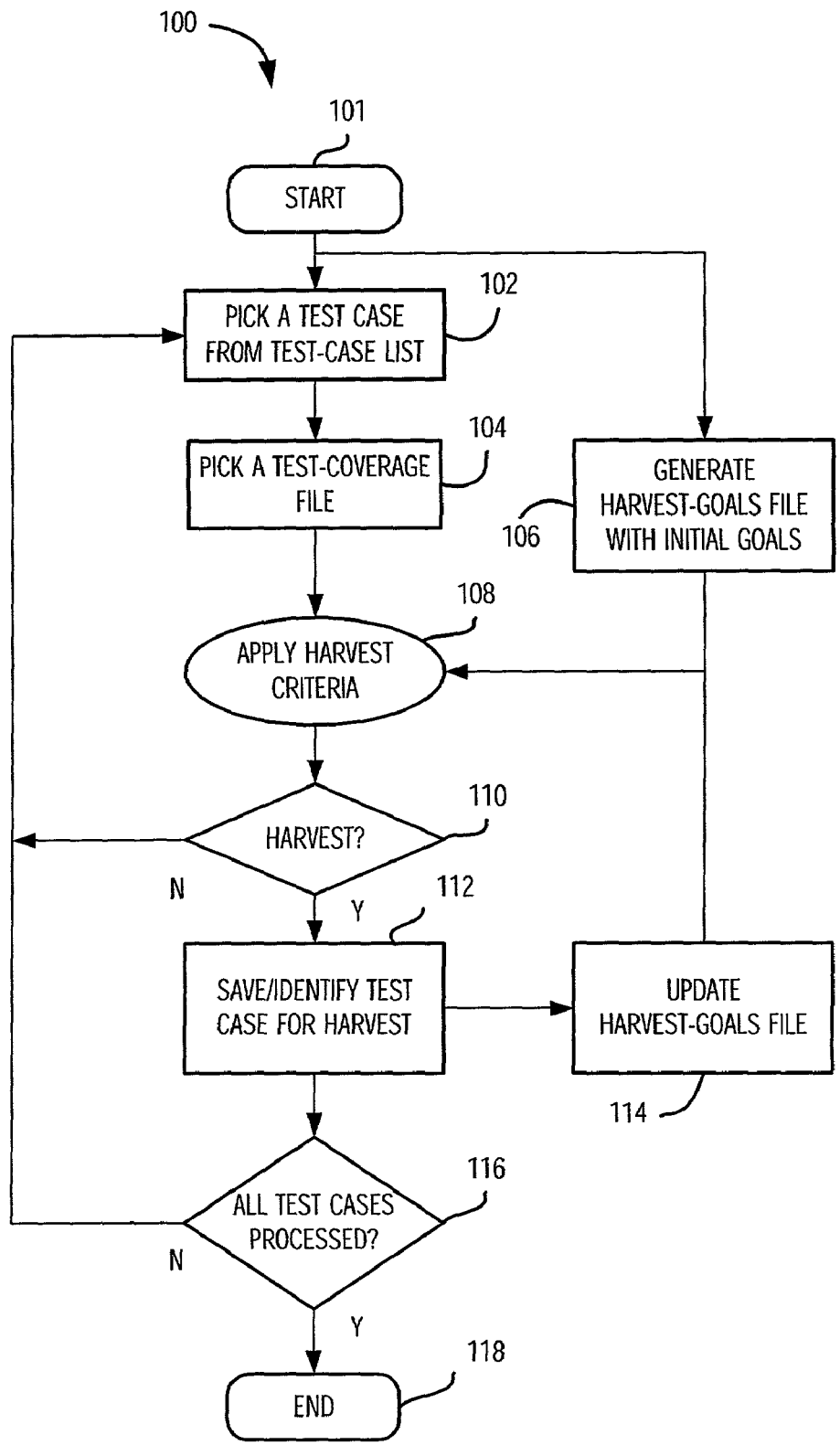
FIG. 1 depicts a flow diagram of a harvesting feature after test-case generation.
Figure 2:
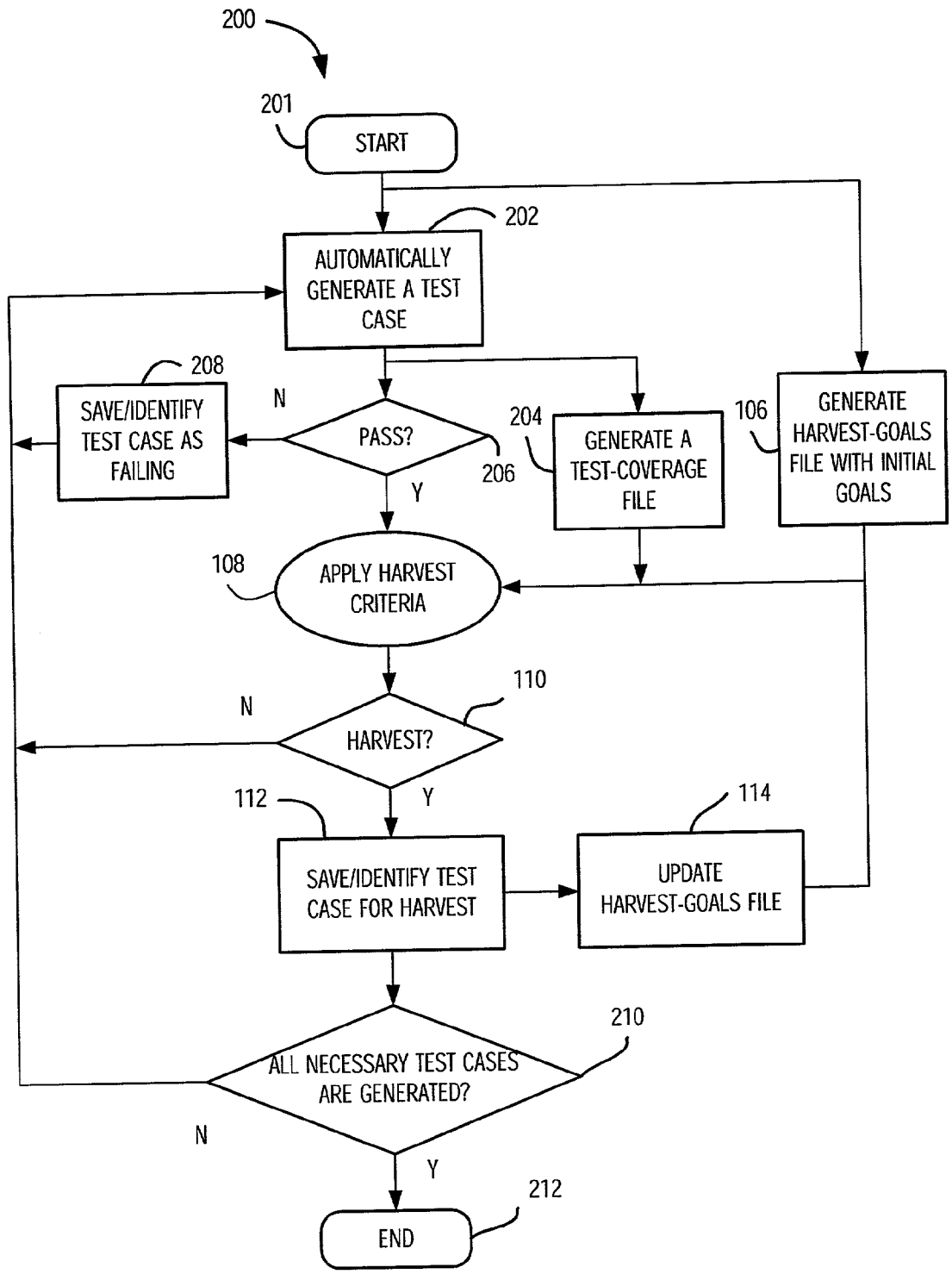
FIG. 2 depicts a flow diagram of a harvesting feature during test-case generation.
Figure 3:
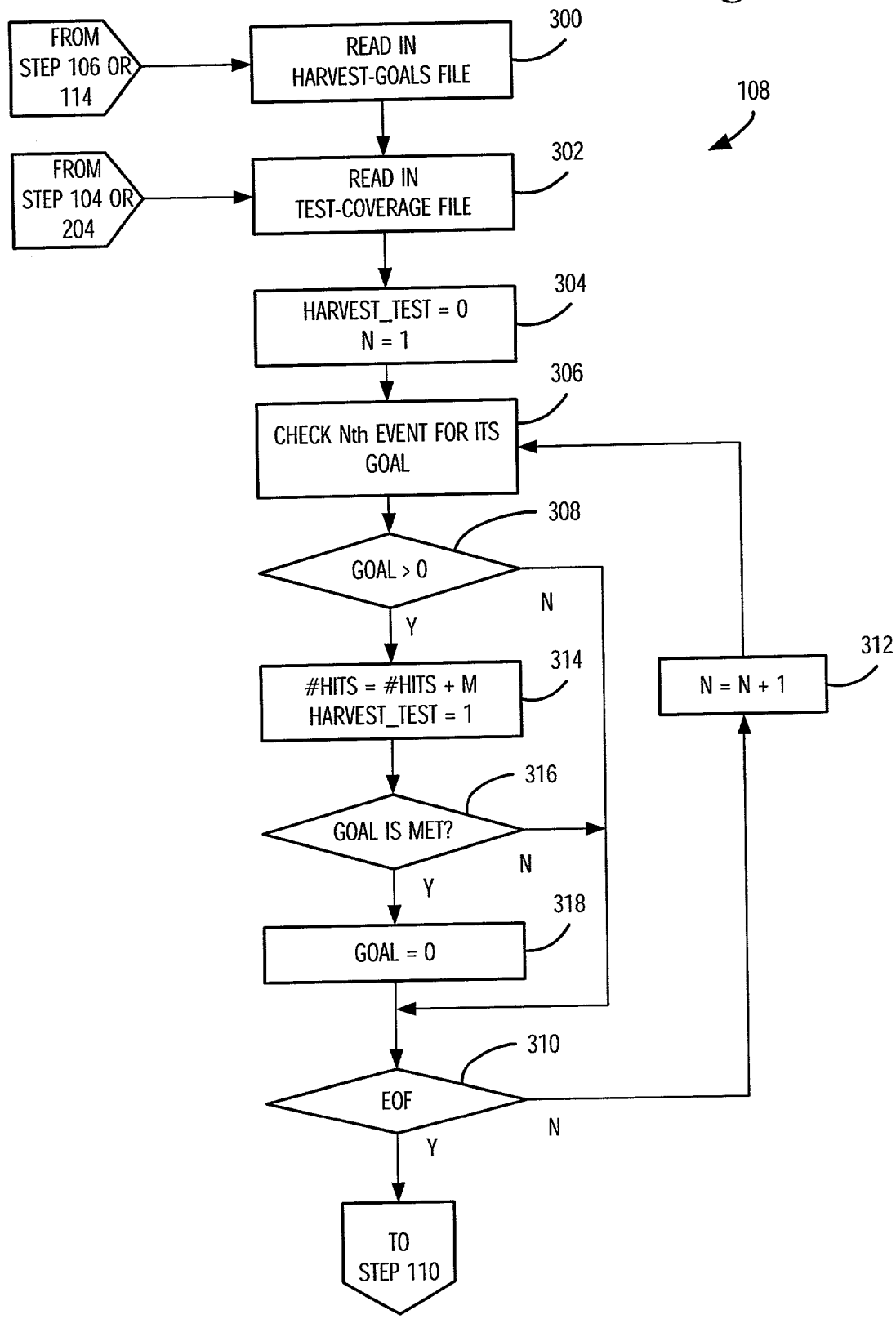
FIG. 3 depicts a flow diagram of a basic harvest criteria algorithm incorporated in FIGS. 1 and 2.

The principles of the present invention and their advantages are best understood by referring to the illustrated operations of embodiment depicted in FIGS. 1–3.

It is further noted that, unless indicated otherwise, all functions described herein are performed by a processor such as a computer or electronic data processor in accordance with code such as computer program code, software, and/or integrated circuits that are coded to perform such functions.

Referring to FIG. 1 of the drawings, reference numeral 100 generally designates a flow diagram depicting the operation of a harvesting feature after test-case generation. In step 101, the flow diagram 100 starts. Preferably, a test-case list is already generated in or prior to step 101. The method of generating test cases is well-known in the relevant art, and thus will not be explained in detail herein. In or prior to step 101, test cases contained in the test-case list may be generated as explained in FIG. 2.

The test-case list contains a list of test cases designed to test a logic circuit. In step 102, a test case is picked from the test-case list generated in or prior to step 101. The test-case list contains a plurality of test cases, i.e., system inputs. Design engineers develop a test bench that completely exercises a behavioral description of a circuit under test. A test bench is basically a functional definition of a system in terms of inputs and outputs. Test cases are generated to test the behavior of the circuit under test or a portion thereof. Thus, a plurality of test cases are normally required to cover all aspects of the behavior of the entire circuit under test.

In a complex circuit design, automatic test case generation is generally used to generate the test cases necessary to create the sequences and events necessary to meet the test coverage criteria. A large number of test cases are created, at least some of which are redundant. When the circuit design needs to be re-verified due to a logic change, the regression testing is very time consuming and resource consuming. The present invention solves this problem by adopting the following steps.

In step 104, a coverage monitor (not shown) included within a test bench (not shown) creates test-coverage files. Coverage monitors (not shown) must be created to run during the simulation to detect and count the events detected or "hit" for each test case and write to a monitor data file (not shown). The term "hit" is defined herein to indicate an occurrence or occurring of an event. For example, a test-coverage file having four events may have the following:

| #Events | #Number of Hits |
|---|---|
| Event_one | 4 |
| Event_two | 3 |
| Event_three | 0 |
| Event_four | 1 |
| #EOF | |

In this example, the Event_three was not hit by the test case.

In step 106, a harvest-goals file is generated. The harvest-goals file may be manually created by a test engineer, or automatically created by a software program having a harvesting feature of the present invention. The software program will be called a "harvester" hereinafter for the sake of convenience. The harvest-goals file contains a list of all test-coverage events, an initial goal for each event, and an accumulative count of hits. The initial goal represents the number of hits required for each event. For example, an event can be a state machine transition, a particular bus operation, or a sequence of operations. A goal represents the number of times an event must be hit in the simulation before the event is considered to be sufficiently tested. An accumulative count of hits represents the number of hits performed so far for each event. Thus, the initial harvest goals file contains a list of test-coverage events and corresponding goals. For example, a harvest-goals file may contain the following information:

| #Events | #Goals | #Accumulative counts of hits |
|---|---|---|
| Event_one | 10 | 0 |
| Event_two | 10 | 0 |
| Event_three | 10 | 0 |
| Event_four | 50 | 0 |
| #EOF | | |

This harvest-goals file will be used to illustrate subsequent steps of FIG. 1.

In step 108, harvest criteria are applied using the harvest-goals file. A preferred embodiment of step 108 has been described in FIG. 3. In step 110, it is determined whether to "harvest" a test case. If a test case under process is worth harvesting based on the outcome of the step 108, the test case is identified and saved (i.e., harvested) in step 112. In step 114, the harvest-goals file with initial goals created in the step 106 is updated by adjusting the accumulative count of hits for each event. In step 116, it is determined whether all test cases in the test-case list are processed. If not, another test case is picked in step 102. If all test cases are processed, then the flow diagram 100 ends in step 118. Steps 108, 110, 112, and 114 form a feedback loop, so that goals are modified and corresponding events are retired, if the accumulative counts of hits for the corresponding events reach the goals. As goals are met and corresponding events are retired, redundant test cases are identified and discarded. Valuable test cases are identified and kept for future regression testing.

The harvest-goals file shown above as an example is modified to reflect the accumulative count of hits after step 114 as follows:

| #Events     | #Goals | #Accumulative counts of hits |
|-------------|--------|------------------------------|
| Event_one   | 10     | 4                            |
| Event_two   | 10     | 3                            |
| Event_three | 10     | 0                            |
| Event_four  | 50     | 1                            |
| #EOF        |        |                              |

If two more test cases with the same test-coverage file were sent through a harvester, the harvest-goals file would contain, for example:

| #Events     | #Goals | #Accumulative counts of hits |
|-------------|--------|------------------------------|
| Event_one   | 0      | 12                           |
| Event_two   | 10     | 9                            |
| Event_three | 10     | 0                            |
| Event_four  | 50     | 3                            |
| #EOF        |        |                              |

Here, the Event_one has been retired (i.e., its goal is set to zero). In this example, the goal for the Event_one is set to zero to indicate that the Event_one is retired, however, the goal may be set to a different value as long as the different value so indicates. If a test case having a test-coverage file that only hits the Event_one is run through the harvester, the test case will not be harvested and will be identified as redundant. As apparent in the last two examples of a harvest-goals file, the accumulative counts of hits represent all counts of hits since the harvest-goals file is generated. For each event, this accumulative count is compared to a corresponding goal. If the accumulative count of hits for an event reaches its goal, the goal is considered met and the event is retired. A detailed example of how to implement the step 108 is presented in FIG. 3.

FIG. 2 depicts a flow diagram 200 of the operation of a harvesting feature during test-case generation, whereas the flow diagram 100 of FIG. 1 depicts the operation of a harvesting feature after test-case generation. Unlike the flow diagram 100 of FIG. 1, the process of generating test cases is merged in the flow diagram 200. Generally, harvesting during test-case generation is performed to identify test cases that are hitting certain hard-to-find test events. Compared with harvesting an already created test-case list, harvesting during test-case generation can greatly reduce the size of goals file. The events left are those whose goals have still not been met yet even after a long simulation. These events therefore are considered hard-to-find. The automatic test-case generation can run continuously while the valuable tests that hit the events are identified. Test cases that do not hit the events or hit events that are already retired (i.e., events whose goal is already met) are discarded.

In step 202, test cases are automatically generated. In one embodiment of the present invention, the automatic test-case generation of step 202 is performed using a parameter file (not shown) and a test bench (not shown). The test bench is generated by a coverage monitor (not shown). The coverage monitor is included within the test bench to generate a test-coverage file in step 204. The automatic test-case generation in step 202 uses the parameter file and the test bench to indicate the type of test cases to be generated. The parameter file describes the system or hardware under test and the types of transactions (read/write) to be generated by different behavioral models within the test bench.

In step 204, a test-coverage file is created for a test case generated in step 202. In step 106, harvest goals file is generated with events and corresponding initial goals, as described in FIG. 1. The test cases generated in step 202 are run in a test-coverage tool, which determines whether the test cases "pass" or "fail" in step 206. A test case has expected results. The expected results are not directly related to test coverage. If the expected results are not received, then the test case "fails," and is not considered worthy of harvesting. A simulation engineer, however, should determine whether unexpected results are due to a faulty test case or a faulty logic. If a test case has unexpected results due to a faulty logic, the test case "pass" in step 206, even though expected results are not received. If they fail, the test cases are identified and saved as "failing" in step 208, and another set of test cases is automatically created in step 202. Once test cases are determined to pass in step 206, step 108 of harvest criteria comes in. Steps 108, 110, 112, and 114 have been explained above in relation to FIG. 1.

In step 210, it is determined whether all necessary test cases are generated in step 202. If so, the flow diagram 200 ends in step 212. If there are more test cases to be generated in step 202, then the flow diagram 200 goes to step 202.

Now referring to FIG. 3, the reference numeral 108 generally designates the harvest criteria as incorporated in FIGS. 1 and 2. The harvest criteria 108 as shown in FIG. 3 present merely a preferred embodiment of the present invention, and thus may be modified without departing from its true spirit. As mentioned above, a software program having a harvesting feature of the present invention will be called a "harvester" for the sake of convenience. Preferably, the harvester may be installed in a computer having a test-coverage software tool. Optionally, the harvester may be integrated in a test-coverage tool. The harvest criteria 108 may be considered a preferred algorithm of the harvester to harvest the most effective test cases and discard redundant test cases, thereby speeding up regression testing and identifying valuable test cases.

In step 300, the harvester reads in a harvest-goals file, which contains a list of goals and hits for test-coverage events resulting from a test case. For example, the harvester may read in the exemplary harvest-goals file shown above in relation to FIG. 1. As mentioned above, a goal indicates the number of hits required for a corresponding event. Typically, an event is a state machine transition, a particular bus operation, or a sequence of operations. In step 302, the harvester reads in test-coverage files, which may be created by a test-coverage software tool. For example, the harvester may read the exemplary test-coverage file shown above in relation to FIG. 1. Preferably, the harvester reads one test-coverage file at a time. In step 304, the value of the harvest_test is set to zero, indicating that test cases are not to be harvested. The value of the harvest test may be a different value, as long as the different value indicates that test cases are not to be harvested. Also, a variable N is set to 1.

In step 306, the computer checks the $1^{st}$ event for its goal, since N is set to 1 in step 304. In step 308, the computer determines whether the goal corresponding to the $1^{st}$ event is larger than zero. Although a different value of a goal may be used to indicate that the goal is already met or no goal is set (i.e., no hit is required for the event), a goal is set to zero to so indicate herein for the sake of convenience. If the goal is zero, then the event corresponding to the goal has been "retired." In that case, the computer determines whether there is another event in the harvest-goals file in step 310. If the harvest-goals file does not return end of file (EOF), N is incremented by 1 in step 312. If, in step 308, the goal is larger than zero, the number of hits is incremented by M in step 314. M is an integer indicating the number of hits for the goal found in the test-coverage file. Also, the harvest_test is set to 1, indicating that test cases are to be harvested. As mentioned above, the value of harvest_test may be a different value, as long as the different value indicates that test cases are to be harvested. In step 316, it is determined whether the goal is met. In this step, the goal is met if the number of hits is larger than the initial goal. If the goal is met, then the corresponding event is retired by forcing the goal to zero in step 318. If the goal is not met in the step 316, then the step 318 is skipped. The loop formed by steps 306 through 318 essentially enables a test engineer to reduce the number of test cases by systematically discarding redundant test cases and harvesting effective test cases.

If step 310 returns EOF (i.e., no more event-goal pairs in the harvest goals file), then step 108 ends. As mentioned above relating to FIGS. 1 and 2, step 108 is followed by step 110 to determine whether to "harvest" the test case under process. In FIG. 3, the determination is whether the value of harvest_test is zero or one. If it is one, the test case is harvested. If zero, it is not harvested.

The following exemplifies a code representation of the harvest criteria set forth in step 108 of FIG. 3, using a pseudo programming language.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

The invention claimed is:

1. A computer implemented method for selecting test cases, comprising the steps of:
   a) generating a harvest-goals file containing a list of events, an initial goal for each event, and an accumulative count of hits for each event;
   b) picking a test case from a test-case list previously generated for a test simulation of a logic circuit design;
   c) picking a corresponding test-coverage file for the test case, the test-coverage file containing one or more events and corresponding number of hits;
   d) applying harvest criteria to the test case by using the test-coverage file and the harvest-goals file, wherein it is determined whether the accumulative count of hits for each event meets the initial goal, the accumulative count of hits for an event being incremented by the number of hits for the event contained in the test-coverage file;
   e) determining whether to harvest the test case based on the determination made in the step d);
   f) saving and identifying the test case for harvest, if the test case is determined to be harvested in the step e);
   g) updating harvest-goals file by adjusting the accumulative count of hits; and
   h) determining whether all test cases in the test-case list are processed by analyzing the harvest-goals file.

2. The method of claim 1, further comprising the step of: repeating the steps b) through h) for another test case in the test-case list, if it is determined in the step h) that all test cases in the test-case list are not processed.

```
#Read in Harvest Goals file (EVENT -> #GOAL, #HITS)
#Read in test_coverage_file
$harvest_test = 0                              #initialize not to harvest
foreach EVENT ($test_coverage_file) {          #check each test_coverage_file event
    M = $test_coverage_file{EVENT}             #set M to the number of hits found in
                                               the test_coverage_file.
    if($goals{EVENT} [event_goal] >0 {         #Is the goal for this event largerthan
                                               0?
        $goals{EVENT}[HITS] +=M;               #Then, increment the count of hits by
                                               the number of hits found in the
                                               test_coverage_file.
        $harvest_test = 1;                     #and indicate that it will be harvested
    } else {                                   #If not, skip the event
        next;
    }
    if ($goals{EVENT}[event_goal] < $goals{EVENT}[hits]) {
                                               #Is the goal for this event met?
        $goals{EVENT}[EVENT_GOAL] = 0
                                               #Then retire the event by forcing the
                                               goal to zero
    }
}
```

3. The method of claim 1, further comprising the step of:
updating the initial goal to indicate that the corresponding event is retired, if the accumulative count of hits reach the initial goal.

4. The method of claim 1, wherein the initial goals are manually generated.

5. The method of claim 1, wherein the initial goals are automatically generated by using pre-programmed default goals.

6. The method of claim 1, further comprising the step of generating test cases.

7. A computer implemented method for determining whether a test case should be selected for a list of test cases, comprising the steps of:
   a) generating a harvest-goals file containing a list of events, an initial goal for each event, and an accumulative count of hits for each event;
   b) generating a test case;
   c) generating a corresponding test-coverage file for the test case, the test-coverage file containing one or more events and corresponding number of hits;
   d) applying harvest criteria to the test case by using the test-coverage file and the harvest-goals file, wherein it is determined whether the accumulative count of hits for each event meets the initial goal, the accumulative count of hits for an event being incremented by the number of hits for the event contained in the test-coverage file;
   e) determining whether to harvest the test case based on the determination made in the step d);
   f) saving and identifying the test case for harvest, if the test case is determined to be harvested in the step e);
   g) updating harvest-goals file by adjusting the accumulative count of hits; and
   h) determining whether all necessary test cases are generated in the step b), by analyzing the harvest-goals file.

8. The method of claim 7, wherein the step b) further comprises the steps of:
   generating a coverage monitor;
   generating a parameter file; and
   generating a test bench.

9. The method of claim 7, further comprising the steps of:
   determining whether the test case is faulty; and
   saving and identifying the test case as failing, if the test case is determined to be faulty.

10. The method of claim 7, further comprising the step of:
    repeating to the steps b) through h) for another test case, if it is determined in the step h) that all necessary test cases are not generated in the step a).

11. A computer implemented method for selecting test cases, comprising the steps of:
    a) reading in a harvest-goals file containing a list of events, an initial goal for each event, and an accumulative count of hits for each event;
    b) reading in a test-coverage file containing one or more events and corresponding number of hits;
    c) determining if the goal for an event is met;
    d) incrementing the number of the accumulative hits in the harvest-goals file by the number of hits in the test-coverage file;
    e) determining whether the accumulative count of hits for each event meets the corresponding initial goal;
    f) retiring the current event by forcing the goal to a value to indicate that the goal is already met, if the initial goal is met in the step e);
    g) determining if there is another event to evaluate by analyzing the harvest-goals file; and
    h) repeating steps c) through g) for another event, if there is another event to evaluate.

12. The method of claim 11, wherein the step c) further comprises the step of setting a variable to be a first constant, indicating that the test case is not to be harvested.

13. The method of claim 11, wherein the step c) further comprises the step of setting a variable to be a first constant, indicating that the test case is not to be harvested, and the step f) comprises the step of setting the variable to be a second constant, indicating that the test case is to be harvested.

14. The method of claim 11, wherein the step h) further comprises the step of determining if the number of the hits is larger than the goal.

15. The method of claim 11, wherein the step b) further comprises the step of reading in a file containing information on events, and the step j) comprises the step of determining if there is another event to evaluate in the file.

16. The method of claim 11, wherein the step a) further comprises the step of reading in a file containing information on goals and hits, and the step 1) further comprises the step of updating the file, if all events have been evaluated.

17. A computer program product for selecting test cases, the computer program product having a computer readable medium with a computer program embodied thereon, wherein the computer program when executed causes the computer to perform the following functions, the computer program comprising:
    computer program code for generating a harvest-goals file containing a list of events, an initial goal for each event, and an accumulative count of hits for each event;
    computer program code for picking a corresponding test case from a test-case list previously generated for a test simulation of a logic circuit design;
    computer program code for picking a test-coverage file for the test case, the test-coverage file containing one or more events and corresponding number of hits;
    computer program code for applying harvest criteria to the test case by using the test-coverage file and the harvest-goals file, wherein it is determined whether the accumulative count of hits for each event meets the initial goal, the accumulative count of hits for an event being incremented by the number of hits for the event contained in the test-coverage file;
    computer program code for determining whether to harvest the test case based on the determination whether the number of hits for each event meets the initial goal;
    computer program code for saving and identifying the test case for harvest, if the test case is determined to be harvested;
    computer program code for updating harvest-goals file by adjusting the accumulative count of hits; and
    computer program code for determining whether all test cases in the test-case list are processed by analyzing the harvest-goals file.

18. A computer program product for selecting test cases, the computer program product having a computer readable medium with a computer program embodied thereon, wherein the computer program when executed causes the computer to perform the following functions, the computer program comprising:
    computer program code for generating a harvest-goals file containing a list of events, an initial goal for each event, and an accumulative count of hits for each event;
    computer program code for generating a test case;

computer program code for generating a corresponding test-coverage file for the test case, the test-coverage file containing one or more events and corresponding number of hits;

computer program code for applying harvest criteria to the test case by using the test-coverage file and the harvest-goals file, wherein it is determined whether the accumulative count of hits for each event meets the initial goal, the accumulative count of hits for an event being incremented by the number of hits for the event contained in the test-coverage file;

computer program code for determining whether to harvest the test case based on the determination whether the number of hits for each event meets the initial goal;

computer program code for saving and identifying the test case for harvest, if the test case is determined to be harvested;

computer program code for updating harvest-goals file by adjusting the accumulative count of hits; and computer program code for determining whether all necessary test cases are generated by analyzing the harvest-goals file.

19. A computer program product for selecting test cases, the computer program product having a computer readable medium with a computer program embodied thereon, wherein the computer program when executed causes the computer to perform the following functions, the computer program comprising:

computer program code for reading in a harvest-goals file containing a list of events, an initial goal for each event, and an accumulative count of hits for each event;

computer program code for reading in a test-coverage file containing one or more events and corresponding number of hits;

computer program code for determining if the goal for an event is met;

computer program code for incrementing the number of the accumulative hits in the harvest-goals file by the number of hits in the test-coverage file; computer program code for determining whether the accumulative count of hits for each event meets the corresponding initial goal;

computer program code for retiring the current event by forcing the goal to a value to indicate that the goal is already met, if the initial goal is met; and computer program code for determining if there is another event to evaluate by analyzing the harvest-goals file.

20. A computer implemented method for selecting test cases used to meet the test coverage criteria for a logic circuit design, wherein a first constant indicates that an event met an initial goal, comprising the steps of:

a) reading in a harvest-goals file containing a list of events, the initial goal for each event, and an accumulative count of hits for each event;

b) reading in a test-coverage file containing one or more events and corresponding number of hits;

c) determining if the goal for an event is met by analyzing the harvest-goals file, wherein if the initial goal is met go to step g);

d) incrementing the number of the accumulative hits in the harvest-goals file by the number of hits in the test-coverage file;

e) determining whether the accumulative count of hits for each event meets the corresponding initial goal;

f) retiring the current event by forcing the goal to the first constant if the initial goal is met in the step e);

g) determining if there is another event to evaluate by analyzing the harvest-goals file;

h) repeating steps c) through g) for another event, if there is another event to evaluate; and i) updating the file if all events have been evaluated.

* * * * *